(12) United States Patent
Gong et al.

(10) Patent No.: US 9,281,500 B2
(45) Date of Patent: Mar. 8, 2016

(54) ORGANIC LIGHT EMITTING FILM PACKAGE STRUCTURE, DEVICE, APPARATUS, AND FABRICATION THEREOF

(71) Applicants: Shanghai Tianma AM-OLED Co., Ltd., Shanghai (CN); Tianma Micro-Electronics Co., Ltd., Shenzhen (CN)

(72) Inventors: Yiping Gong, Shanghai (CN); Zaifeng Xie, Shanghai (CN)

(73) Assignees: Shanghai Tianma AM-OLED Co., Ltd., Shanghai (CN); Tianma Micro-Electronics Co., Ltd., Shenzhen (CN)

( * ) Notice: Subject to any disclaimer, the term of this patent is extended or adjusted under 35 U.S.C. 154(b) by 0 days.

(21) Appl. No.: 14/522,566

(22) Filed: Oct. 23, 2014

(65) Prior Publication Data

US 2015/0380678 A1 Dec. 31, 2015

(30) Foreign Application Priority Data

Jun. 30, 2014 (CN) .......................... 2014 1 0307012

(51) Int. Cl.
*H01L 21/02* (2006.01)
*H01L 51/52* (2006.01)
*H01L 51/56* (2006.01)

(52) U.S. Cl.
CPC ............ *H01L 51/5253* (2013.01); *H01L 51/56* (2013.01); *H01L 21/0214* (2013.01); *H01L 21/02126* (2013.01); *H01L 2251/558* (2013.01)

(58) Field of Classification Search
CPC ................... H01L 21/0214; H01L 21/02126; H01L 51/553; H01L 51/562
See application file for complete search history.

(56) References Cited

U.S. PATENT DOCUMENTS

| 6,982,472 B2 * | 1/2006 | Kiyotoshi | H01L 23/5223 257/277 |
| 7,220,489 B1 * | 5/2007 | Wei et al. | C23C 28/04 359/848 |
| 8,388,408 B2 * | 3/2013 | Kobayashi et al. | B24B 37/013 451/5 |
| 9,029,783 B2 * | 5/2015 | Cannata et al. | G01J 5/20 250/349 |

(Continued)

FOREIGN PATENT DOCUMENTS

CN 1910746 A 2/2007
CN 103046001 A 4/2013

*Primary Examiner* — Ida M Soward
(74) *Attorney, Agent, or Firm* — Alston & Bird LLP

(57) ABSTRACT

An organic light emitting film package structure includes an organic light emitting unit and a film structure covering the organic light emitting unit. The film structure includes a first film as a bottom layer, a second film as a top layer, and a transition layer disposed between the first second films. The first film is SiX or SiXY, the second film is SiY or SiXY, and the transition layer includes multiple $SiX_nY_m$ layers. The first and second films have different materials. A difference in atomic ratio of X or Y between two adjacent $SiX_nY_m$ layers in the transition layer is greater than a difference in atomic ratio of X or Y between the first film and its adjacent $SiX_nY_m$ layer or a difference in atomic ratio of X or Y between the second film and its adjacent $SiX_nY_m$. The value of m and n ranges from 0 to 1, inclusive.

19 Claims, 1 Drawing Sheet

(56) References Cited

U.S. PATENT DOCUMENTS

2006/0192248 A1* 8/2006 Wang ............... H01L 21/28282
                                                        257/324
2007/0187793 A1* 8/2007 Moon et al. ............ G02B 5/201
                                                        257/440
2014/0103354 A1* 4/2014 Hu ...................... H01L 29/2003
                                                        257/76

* cited by examiner

ORGANIC LIGHT EMITTING FILM PACKAGE STRUCTURE, DEVICE, APPARATUS, AND FABRICATION THEREOF

CROSS-REFERENCES TO RELATED APPLICATIONS

This application claims the benefit of priority to Chinese Patent Application No. 201410307012.9, filed with the Chinese Patent Office on Jun. 30, 2014 and entitled "ORGANIC LIGHT EMITTING FILM PACKAGE STRUCTURE, DEVICE, APPARATUS, AND FABRICATION THEREOF", the content of which is incorporated herein by reference in its entirety.

BACKGROUND OF THE INVENTION

Existing Organic Light-Emitting Diode (OLED) film package structures have the following three types.

The first type is an inorganic-inorganic Package on Package, including an inorganic layer A with a porous structure, primarily configured to dissipate stress, and a dense inorganic layer B, primarily configured to separate water vapor and oxygen.

The second type is an inorganic-organic Package on Package, including an organic layer, primarily configured to dissipate stress, and a dense inorganic layer, primarily configured to separate water vapor and oxygen.

The third type is a hybrid polymer-inorganic Package on Package, including a hybrid polymer layer, primarily configured to dissipate stress, and a dense inorganic layer, primarily configured to separate water vapor and oxygen.

An existing preparation method for an OLED film package includes: depositing an inorganic layer by Plasma Enhanced Chemical Vapor Deposition (PECVD) on a prepared OLED device, depositing an organic layer by PECVD, and depositing 3-7 layers in the same way, to form a film package structure. In addition, a protective layer may be deposited before depositing the films, to prevent device damage.

Among the above OLED film package structures, there is no package structure appeared with good comprehensive performance in terms of resistance to stress, water vapor transmission rate (WVTR) and oxygen transmission rate (OTR), light transmittance and refractive index.

BRIEF SUMMARY OF THE INVENTION

To solve the problems above, embodiments of the present invention provide an organic light emitting film package structure, an organic light emitting device, and a method for manufacturing an organic light emitting film package structure. In an embodiment, an organic light emitting film package structure includes an organic light emitting unit and a film structure covering the organic light emitting unit. The film structure includes a first film as a bottom layer, a second film as a top layer, and a transition layer disposed between the first film and the second film. The first film is SiX or SiXY, the second film is SiY or SiXY, and the transition layer includes multiple $SiX_nY_m$ layers, where material of the first film is different from material of the second film. A difference in atomic ratio of X or Y between two adjacent $SiX_nY_m$ layers in the transition layer is greater than a difference in atomic ratio of X or Y between the first film and a $SiX_nY_m$ layer adjacent to the first film or a difference in atomic ratio of X or Y between the second film and a $SiX_nY_m$ layer adjacent to the second film. A value of m or a value of n both range from 0 to 1, inclusive. X is O, C or N, Y is O, C or N, and X and Y are different atoms.

In another embodiment, an organic light emitting device includes an organic light emitting unit and the above-described organic light emitting film package structure.

In yet another embodiment, a display apparatus includes the above-described organic light emitting device.

In some embodiments, a method for manufacturing an organic light emitting film package structure includes: providing an organic light emitting unit; forming a first film of a film structure by PECVD on the organic light emitting unit; forming a transition layer of the film structure by adjusting a gas flow of an introduced gas; and forming a second film by PECVD on the transition layer. The first film is SiX or SiXY, the second film is SiY or SiXY, and the transition layer includes multiple $SiX_nY_m$ layers, where the first film is formed of a material different from a material of the second film. A difference in atomic ratio of X or Y between two adjacent $SiX_nY_m$ layers in the transition layer is greater than a difference in atomic ratio of X or Y between the first film and a $SiX_nY_m$ layer adjacent to the first film or a difference in atomic ratio of X or Y between the second film and a $SiX_nY_m$ layer adjacent to the second film. A value of m and a value of n both range from 0 to 1, inclusive. X is O, C or N, Y is O, C or N, and X and Y are different atoms.

By the technical solutions in the application, a comprehensive performance of the films is ensured under a condition that stress of the films is improved.

DETAILED DESCRIPTION OF THE INVENTION

Figure 1:
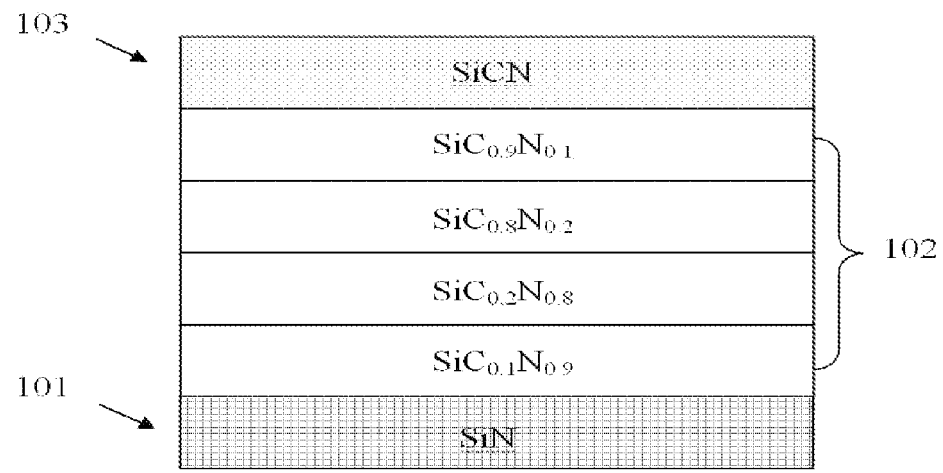
FIG. 1 is a cross-sectional view of a package structure according to an embodiment of the application.

The following detailed description of certain embodiments of the present invention will be better understood when read in conjunction with the accompanying drawings. It should be understood that the embodiments described herein are only provided to described the invention, and are not limiting. It should also be noted that, for convenience of description, only contents relevant to the present invention, instead of all contents, are shown in the drawings.

The recitation of numerical ranges by endpoints includes all numbers subsumed with that range (e.g., 0 to 1 includes 0.1, 0.15, 0.26, and 1.0) and any range within that range.

Relative terms such as "bottom" and "top" are used herein to described a relationship of one element, layer or region to another element, layer or region as illustrated in the figures. It will be understood that these terms are intended to encompass different orientations of the structure in addition to the orientation depicted in the figures.

An organic light emitting film package structure is provided according to an embodiment. The organic light emitting film package structure includes an organic light emitting unit and a film structure covering the organic light emitting unit. The film structure includes a first film disposed at the bottom of the film structure, a second film at the top of the film structure, and a transition layer disposed between the first film and the second film. The first film is SiX or SiXY, the second film is SiY or SiXY, and the transition layer includes multiple $SiX_nY_m$ layers, where the material of the first film is different from the material of the second film. A difference in atomic ratio of X or Y between two adjacent $SiX_nY_m$ layers in the transition layer is greater than a difference in atomic ratio of X or Y between the first film and a $SiX_nY_m$ layer adjacent to the first film or a difference in atomic ratio of X or Y between the second film and a $SiX_nY_m$ layer adjacent to the second film. A value of m and a value of n both range from 0 to 1, inclusive. X is O, C or N, Y is O, C or N, and X and Y are different atoms. Si is a silicon atom, O is an oxygen atom, C is a carbon atom, and N is a nitrogen atom.

For further understanding of the application, preferable embodiments are provided. The preferable embodiments below are merely to illustrate the invention, while embodiments of the application are not limited to the embodiments below.

First Comparative Example

Firstly, an organic light emitting unit is formed by evaporation, and a buffer layer is formed by vacuum evaporation.

Secondly, a first film is formed above the buffer layer by PECVD. The first film may be an organic-inorganic hybrid layer, an organic layer, or an inorganic layer, such as SiN, SiOC or SiCN. In this comparative example, SiN is adopted as the first film with a thickness of 1 um.

Finally, a second film is formed above the first film by PECVD. The second film is an inorganic layer, such as SiN or SiO. In this comparative example, SiCN is adopted as the second film with a thickness of 1 um.

Second Comparative Example

Firstly, an organic light emitting unit is formed by evaporation.

A buffer layer is formed by vacuum evaporation after the evaporation of the organic light emitting unit. In general, a buffer material may be an organic film of NPB, C60, CPB, or $Alq_3$.

A first film is formed by PECVD. The first film may be an organic-inorganic hybrid layer, an organic layer, or an inorganic layer, such as SiN, SiOC, or SiCN. In this comparative example, SiN is adopted as the first film with a thickness of 0.4 um.

A transition layer is formed by adjusting a gas flow of an introduced gas. In particular, the transition layer includes layers of $SiC_{0.2}N_{0.8}$, $SiC_{0.4}N_{0.6}$, $SiC_{0.6}N_{0.4}$ and $SiC_{0.8}N_{0.2}$ superimposed upon each other from bottom to top, with each of these layers having a thickness of 0.3 um.

Finally, a second film is formed by PECVD. The second film is an inorganic layer, such as SiN or SiO. In the second comparative example, SiCN is adopted as the second film with a thickness of 0.4 um.

First Embodiment

FIG. 1 is a diagram of a film package structure according to an embodiment of the application.

Firstly, an organic light emitting unit (not shown in FIG. 1) is formed by evaporation. A process for forming the organic light emitting unit is well known and will not be described herein.

A buffer layer (not shown in FIG. 1) is form by vacuum evaporation after the evaporation of the organic light emitting unit. In general, a buffer material may be an organic film of NPB, C60, CPB, or $Alq_3$.

A first film 101 is formed by PECVD. The first film 101 may be an organic-inorganic hybrid layer, an organic layer, or an inorganic layer, such as SiN, SiOC, or SiCN. In the embodiment, SiN is adopted as the first film with a thickness of 0.4 um.

A transition layer 102 is formed by adjusting a gas flow of an introduced gas $N_2$. In particular, the transition layer includes multiple layers of $SiC_{0.1}N_{0.9}$, $SiC_{0.2}N_{0.8}$, $SiC_{0.8}N_{0.2}$ and $SiC_{0.9}N_{0.1}$ superimposed from bottom to top, with each of these layer having a thickness of 0.3 um.

Finally, a second film 103 is formed by PECVD. The second film is an inorganic layer, such as SiN or SiO. In the embodiment, SiCN is adopted as the second film with a thickness of 0.4 um.

A difference in atomic ratio of C or N between two adjacent layers in the transition layer is greater than a difference in atomic ratio of C or N between the first film and its adjacent layer in the transition layer or a difference in atomic ratio of C or N between the second film and its adjacent layer in the transition layer. In the embodiment, the difference in atomic ratio of C between the first film and its adjacent layer in the transition layer is 0.1, and the difference in atomic ratio of N between the first film and its adjacent layer in the transition layer is 0.1. The difference in atomic ratio of C between two adjacent layers $SiC_{0.2}N_{0.8}$ and $SiC_{0.8}N_{0.2}$ is 0.6, and the difference in atomic ratios of N between two adjacent layers $SiC_{0.2}N_{0.8}$ and $SiC_{0.8}N_{0.2}$ is 0.6, which are greater than the above differences in atomic ratio between the first film and its adjacent layer in the transition layer. The embodiment is only a preferable embodiment, and the structure of the transition layer may be adjusted by those skilled in the art, as long as the above condition is met, i.e., the difference in atomic ratio of C or N between two adjacent layers in the transition layer is greater than a difference in atomic ratio of C or N between the first film and its adjacent layer in the transition layer or a difference in atomic ratio of C or N between the second film and its adjacent layer in the transition layer. In addition, another preferable design scheme is further provided in the application, that is, from top to bottom or from bottom to top of the transition layer, the difference in atomic ratio between two adjacent layers in the transition layer gradually increases and then gradually decreases; the film package structure may be designed by those skilled in the art according to the design scheme.

Second Embodiment

Firstly, an organic light emitting unit is formed by evaporation.

A buffer layer is formed by vacuum evaporation after the evaporation of the organic light emitting unit. In general, buffer material may be an organic film of NPB, C60, CPB, or $Alq_3$.

A first film is formed by PECVD. The first film may be an organic-inorganic hybrid layer, an organic layer, or an inorganic layer, such as SiN, SiOC, or SiCN. In the embodiment, SiN is adopted as the first film with a thickness of 0.2 um.

A transition layer is formed by adjusting a gas flow of an introduced gas $N_2$. In particular, the transition layer includes layers of $SiC_{0.1}N_{0.9}$, $SiC_{0.2}N_{0.8}$, $SiC_{0.8}N_{0.2}$ and $SiC_{0.9}N_{0.1}$ superimposed from bottom to top, with each of these layers having a thickness of 0.4 um.

Finally, a second film is formed by PECVD. The second film is an inorganic layer, such as SiN or SiO. In the embodiment, SiCN is adopted as the second film with a thickness of 0.2 um.

Third Embodiment

Figure 2:
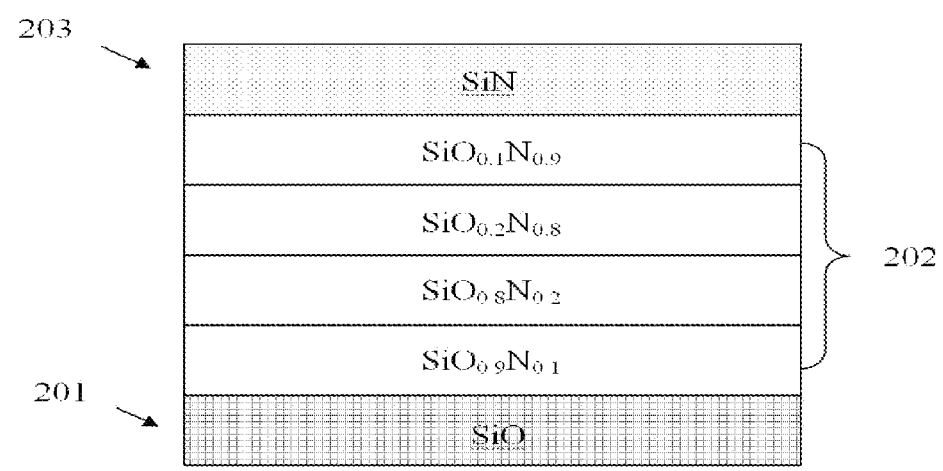
FIG. 2 is a cross-sectional view of a package structure according to another embodiment of the application.

FIG. 2 is a diagram of a film package structure according to the third embodiment.

Firstly, an organic light emitting unit is formed by evaporation.

A buffer layer is formed by vacuum evaporation after the evaporation of the organic light emitting unit. In general, buffer material may be an organic film of NPB, C60, CPB, or $Alq_3$.

A first film 201 is formed by PECVD. The first film 201 may be an organic-inorganic hybrid layer, an organic layer, or an inorganic layer, such as SiN, SiOC, or SiCN. In the embodiment, SiO is adopted as the first film with a thickness of 0.4 um.

A transition layer 202 is prepared by adjusting gas flow of an introduced gas $N_2$. In particular, the transition layer includes layers of $SiO_{0.9}N_{0.1}$, $SiO_{0.8}N_{0.2}$, $SiO_{0.2}N_{0.8}$ and $SiO_{0.1}N_{0.9}$ superimposed from bottom to top, with each of these layers having a thickness of 0.3 um.

Finally, a second film 203 is formed by PECVD. The second film 203 is an inorganic layer, such as SiN or SiO. In the embodiment, SiN is adopted as the second film with a thickness of 0.4 um.

Fourth Embodiment

Firstly, an organic light emitting unit is formed by evaporation.

A buffer layer is formed by vacuum evaporation after the evaporation of the organic light emitting unit. In general, buffer material may be an organic film of NPB, C60, CPB, or $Alq_3$.

A first film is formed by PECVD. The first film may be an organic-inorganic hybrid layer, an organic layer, or an inorganic layer, such as SiN, SiOC, or SiCN. In the embodiment, SiO is adopted as the first film with a thickness of 0.4 um.

A transition layer is formed by adjusting gas flow of an introduced gas $N_2$. In particular, the transition layer includes layers of $SiO_{0.9}N_{0.1}$, $SiO_{0.7}N_{0.3}$, $SiO_{0.3}N_{0.7}$ and $SiO_{0.1}N_{0.9}$ superimposed from bottom to top, with each of these layers having a thickness of 0.3 um.

Finally, a second film is formed by PECVD. The second film is an inorganic layer, such as SiN or SiO. In the embodiment, SiN is adopted as the second film with a thickness of 0.4 um.

Fifth Embodiment

Firstly, an organic light emitting unit is formed by evaporation.

A buffer layer is formed by vacuum evaporation after the evaporation of the organic light emitting unit. In general, buffer material may be an organic film of NPB, C60, CPB, or $Alq_3$.

A first film is formed by PECVD. The first film may be an organic-inorganic hybrid layer, an organic layer, or an inorganic layer, such as SiN, SiOC, or SiCN. In the embodiment, SiO is adopted as the first film with a thickness of 0.4 um.

A transition layer is formed by adjusting a gas flow of an introduced gas $N_2$. In particular, the transition layer includes layers of $SiO_{0.9}N_{0.1}$, $SiO_{0.7}N_{0.3}$, $SiO_{0.2}N_{0.8}$ and $SiO_{0.1}N_{0.9}$ superimposed from bottom to top, with each of these layers having a thickness of 0.3 um.

Finally, a second film is formed by PECVD. The second film is an inorganic layer, such as SiN or SiO. In the embodiment, SiN is adopted as the second film with a thickness of 0.4 um.

Performance Tests

Performance tests in 6 aspects including stress, WVTR and OTR, attachment property, light transmittance, refractive index and operability are performed on the first embodiment and the first and second comparative examples. Reference is made to the following information and table for details of test methods and results.

Stress

Interfacial stress is formed due to differences in materials or lattice structures between adjacent films; and the larger the structural difference, the larger the interfacial stress can become. One way for reducing stress may be achieved by choosing similar materials or materials with similar lattice structures.

WVTR and OTR

An extent of loss of Ca film due to the water vapor passing the film is observed by a Mocon machine test.

A multi-layer film may be observed by reliability analysis performed on a film packaged sample (reliability analysis indicates: placing the film packaged sample in 60° C./90% RH or 40° C./90% RH, and observing a guarantee period of the sample).

Attachment Property

A film packaged sample is placed in a certain environment (60° C./90% RH, 40° C./90% RH, or another condition). After a certain period, detachment phenomenon or air pockets of the film are observed through a microscope. The more severe the detachment phenomenon, the worse the attachment property.

Light Transmittance

The light transmittance is tested by a light transmittance tester. A film is coated on a glass substrate, a transmittance of visible light of the glass substrate is tested at first, and then the transmittance of visible light of the glass substrate is used as a reference to test a transmittance of the glass substrate coated with the film.

Refractive Index

A test is performed on a film coated on a wafer by an ellipsometer.

Operability

During preparation of a film, operability is low if the gas flow is adjusted in real time or frequently, and operability is high if the gas flow is not adjusted.

Table 1 shows the levels of performance tests of the first and second comparative examples and the first embodiment. Level 1 is the worst performance and level 5 is the best performance.

TABLE 1

| | stress | WVTR and OTR | attachment property | light transmittance | refractive index | operability |
|---|---|---|---|---|---|---|
| first comparative example | level 1 | level 4 | level 4 | level 4 | level 4 | level 4 |
| second comparative example | level 4 | level 2 | level 2 | level 4 | level 4 | level 3 |
| first embodiment | level 3 | level 3 | level 3 | level 4 | level 4 | level 3 |

*In the above table, the performance is indicated by level 5 to level 1 from good to poor.

The following can be seen from Table 1 above.

Stress. Since two different materials are directly contacted in the first comparative example, a high stress is formed therebetween. A transition layer exists in both the second comparative example and the first embodiment. Because of a uniform transition in the second comparative example, the second comparative example is better than the first embodiment. Therefore, for the performance of stress, the second comparative example>the first embodiment>the first comparative example. In other words, the second comparative example has a stress performance better than that of the first embodiment, which, in turn, is better than that of the first comparative example.

WVTR and OTR. An outermost layer is a water vapor barrier, and an ability of the water vapor barrier is closely related to the number of the layers thereof. If A0.9B0.1 is regarded as superposed layers of 0.9A and 0.1B, then for entire thickness of the outermost layer of the water vapor barrier, the first comparative example (if 300)>the first embodiment (100+90+80)>the second comparative example (100+80+60). Therefore, for the ability of the water vapor barrier, the first comparative example>the first embodiment>the second comparative example.

Ability of attachment to a device. The ability of attachment to a device is related to a layer to be combined with an OLED device, and also related to the thickness of the layer to be combined, with a same principle as the water vapor transmission. Therefore, for the ability of attachment to a device, the first comparative example>the first embodiment>the second comparative example.

Refractive index and light transmittance. For an entire device, under conditions that a thickness of an entire package layer is the same and other conditions for evaporation are the same, the refractive index is the same and the light transmittance is the same. Therefore, for the refractive index and light transmittance, the first comparative example=the second comparative example=the first embodiment. In other words, the refractive index and light transmittance of the first and second comparative examples and the first embodiment are equally good.

Operability. Because gas flow is needed to be controlled whenever necessary in the second comparative example and in the first embodiment, the operability is poorer than that of the first comparative example. Therefore, for the operability, the first comparative example>the second comparative example=the first embodiment.

In summary, the structure in the first comparative example is good at WVTR and OTR, attachment ability, operability, refractive index and light transmittance. However, the high stress between films in the first comparative example will bring severe problems such as peeling of films and cracks and cause a failure of the package.

The stress between films of the structure in the second comparative example is greatly improved. However, other performances of the films are significantly reduced.

The stress between films of the structure in the embodiment of the application is improved, and other performances of the films are ensured.

In summary, for an OLED package, in comparison with the first comparative example and the second comparative example, the embodiment of the application provides a structure with a best comprehensive performance.

An organic light emitting device is further provided according to an embodiment of the application, including an organic light emitting unit and the above film structure.

A display apparatus is further provided according to an embodiment of the application, including the above organic light emitting device.

A method for manufacturing an organic light emitting film package structure is provided according to an embodiment of the present invention. The method includes providing an organic light emitting unit having a plurality of organic light emitting diodes and other related components; forming a first film of a film structure by PECVD on the organic light emitting unit; forming a transition layer of the film structure by adjusting a gas flow of an introduced gas; and forming a second film by PECVD on the transition layer. A process of forming the organic light emitting unit is well known and will not be described herein.

The first film is SiX or SiXY, the second film is SiY or SiXY, and the transition layer includes multiple $SiX_nY_m$ layers, where material of the first film is different from material of the second film.

A difference in atomic ratio of X or Y between two adjacent $SiX_nY_m$ layers in the transition layer is greater than a difference in atomic ratio of X or Y between the first film and a $SiX_nY_m$ layer adjacent to the first film or a difference in atomic ratio of X or Y between the second film and a $SiX_nY_m$ layer adjacent to the second film.

A value of m and a value of n both range from 0 to 1, inclusive.

X is O, C or N, Y is O, C or N, and X and Y are different atoms.

Referring to FIGS. 1 and 2, the first film can be a SiN film or a SiO film. The second film can be SiCN or SiN. The $SiX_nY_m$ layers can be $SiC_nV_m$ layers or $SiO_nN_m$ layers.

The method further includes forming a buffer layer on the organic light emitting unit prior to forming the first film. The method also includes evaporating the buffer layer after formation of the film structure (comprising the first film, the transition layer, and the second film) on the buffer.

The aforesaid embodiments are merely preferable embodiments of the present invention to make the present invention be better understood by those skilled in the art. However, the scope of protection is not limited thereto. Any modifications, equivalent substitutions and improvements made within the spirit and the principles of the application are contained within the scope of the present invention.

What is claimed is:

1. An organic light emitting film package structure, comprising an organic light emitting unit and a film structure covering the organic light emitting unit, the film structure comprising a first film as a bottom film, a second film as a top film, and a transition layer disposed between the first film and the second film, the first film being SiX or SiXY, the second film being SiY or SiXY, and the transition layer comprising a plurality of $SiX_nY_m$ layers, the first film being of a material different from a material of the second film,
   wherein a difference in atomic ratio of X or Y between two adjacent $SiX_nY_m$ layers in the transition layer is greater than a difference in atomic ratio of X or Y between the first film and a $SiX_nY_m$ layer adjacent to the first film or a difference in atomic ratio of X or Y between the second film and a $SiX_nY_m$ layer adjacent to the second film,
   wherein a value of m and a value of n range from 0 to 1, inclusive;
   wherein X is O, C or N, Y is O, C or N, and X and Y are different atoms.

2. The organic light emitting film package structure according to claim 1, wherein a difference in atomic ratio of X or Y between adjacent $SiX_nY_m$ layers gradually increases and then gradually decreases along a direction from the first film to the second film or along a direction from the second film to the first film.

3. The organic light emitting film package structure according to claim 2, wherein the first film of the film structure is SiCN, the second film of the film structure is SiN, and the transition layer is $SiC_nN_m$.

4. The organic light emitting film package structure according to claim 3, wherein the transition layer comprises a $SiC_{0.9}N$ layer, a $SiC_{0.8}N$ layer, a $SiC_{0.2}N$ layer and a $SiC_{0.1}N$ layer superimposed upon each other along the direction from the first film to the second film.

5. The organic light emitting film package structure according to claim 4, wherein a thickness of the $SiC_{0.1}N$ layer is in a range between 0.1 um and 0.5 um, a thickness of the $SiC_{0.2}N$ layer is in a range between 0.1 um and 0.5 um, a thickness of the $SiC_{0.8}N$ layer is in a range between 0.1 um and 0.5 um, a thickness of the $SiC_{0.9}N$ layer is in a range between 0.1 um and 0.5 um, a thickness of the first film is in a range between 0.2 um and 0.9 um, and a thickness of the second film is in a range between 0.2 um and 0.9 um.

6. The organic light emitting film package structure according to claim 2, wherein the first film is SiO, the second film is SiN, and the transition layer is $SiO_nN_m$.

7. The organic light emitting film package structure according to claim 6, wherein the transition layer comprises a $SiO_{0.9}N_{0.1}$ layer, a $SiO_{0.8}N_{0.2}$ layer, a $SiO_{0.2}N_{0.8}$ layer, and a $SiO_{0.1}N_{0.9}$ layer superimposed upon each other along the direction from the first film to the second film.

8. The organic light emitting film package structure according to claim 7, wherein a thickness of the $SiO_{0.1}N_{0.9}$ layer is in a range between 0.05 um and 0.1 um, a thickness of the $SiO_{0.2}N_{0.8}$ layer is in a range between 0.05 um and 0.1 um, a thickness of the $SiO_{0.8}N_{0.2}$ layer is in a range between 0.05 um and 0.1 um, a thickness of the $SiO_{0.9}N_{0.1}$ layer is in a range between 0.05 um and 0.1 um, a thickness of the first film is in a range between 0.1 um and 0.2 um, and a thickness of the second film is in a range between 0.1 um and 0.2 um.

9. An organic light emitting device, comprising an organic light emitting unit and a film structure covering the organic light emitting unit, the film structure comprising a first film as a bottom film, a second film as a top film, and a transition layer disposed between the first film and the second film, the first film being SiX or SiXY, the second film being SiY or SiXY, and the transition layer comprising a plurality of $SiX_nY_m$ layers, the first film being formed of a material different from a material of the second film,
wherein a difference in atomic ratio of X or Y between two adjacent $SiX_nY_m$ layers in the transition layer is greater than a difference in atomic ratio of X or Y between the first film and a $SiX_nY_m$ layer adjacent to the first film or a difference in atomic ratio of X or Y between the second film and a $SiX_nY_m$ layer adjacent to the second film,
wherein a value of m and a value of n range from 0 to 1, inclusive;
wherein X is O, C or N, Y is O, C or N, and X and Y are different atoms.

10. The organic light emitting device according to claim 9, wherein a difference in atomic ratio of X or Y between adjacent $SiX_nY_m$ layers gradually increases and then gradually decreases along a direction from the first film to the second film or along a direction from the second film to the first film.

11. The organic light emitting device according to claim 10, wherein the first film of the film structure is SiCN, the second film of the film structure is SiN, and the transition layer is $SiC_nN_m$.

12. The organic light emitting device according to claim 11, wherein the transition layer comprises a $SiC_{0.9}N$ layer, a $SiC_{0.8}N$ layer, a $SiC_{0.2}N$ layer, and a $SiC_{0.1}N$ layer superimposed upon each other along the direction from the first film to the second film.

13. The organic light emitting device according to claim 12, wherein a thickness of the $SiC_{0.1}N$ layer is in a range between 0.1 um and 0.5 um, a thickness of the $SiC_{0.2}N$ layer is in a range between 0.1 um and 0.5 um, a thickness of the $SiC_{0.8}N$ layer is in a range between 0.1 um and 0.5 um, a thickness of the $SiC_{0.9}N$ layer is in a range between 0.1 um and 0.5 um, a thickness of the first film is in a range between 0.2 um and 0.9 um, and a thickness of the second film is in a range between 0.2 um and 0.9 um.

14. The organic light emitting device according to claim 10, wherein the first film is SiO, the second film is SiN, and the transition layer is $SiO_nN_m$.

15. The organic light emitting device according to claim 14, wherein the transition layer comprises a $SiO_{0.9}N_{0.1}$ layer, a $SiO_{0.8}N_{0.2}$ layer, a $SiO_{0.2}N_{0.8}$ layer, and a $SiO_{0.1}N_{0.9}$ layer superimposed upon each other along the direction from the first film to the second film.

16. The organic light emitting device according to claim 15, wherein a thickness of the $SiO_{0.1}N_{0.9}$ layer is in a range between 0.05 um and 0.1 um, a thickness of the $SiO_{0.2}N_{0.8}$ layer is in a range between 0.05 um and 0.1 um, a thickness of the $SiO_{0.8}N_{0.2}$ layer is in a range between 0.05 um and 0.1 um, a thickness of the $SiO_{0.9}N_{0.1}$ layer is in a range between 0.05 um and 0.1 um, a thickness of the first film is in a range between 0.1 um and 0.2 um, and a thickness of the second film is in a range between 0.1 um and 0.2 um.

17. A method for manufacturing an organic light emitting film package structure, comprising:
providing an organic light emitting unit;
forming a first film of a film structure on the organic light emitting unit;
forming a transition layer of the film structure on the first film;
forming a second film on the transition layer,
wherein the first film is SiX or SiXY, the second film is SiY or SiXY, and the transition layer comprises a plurality of $SiX_nY_m$ layers, the first film being formed with a material different from a material of the second film;
wherein a difference in atomic ratio of X or Y between two adjacent $SiX_nY_m$ layers in the transition layer is greater than a difference in atomic ratio of X or Y between the first film and a $SiX_nY_m$ layer adjacent to the first film or a difference in atomic ratio of X or Y between the second film and a $SiX_nY_m$ layer adjacent to the second film;
wherein a value of m and a value of n range from 0 to 1, inclusive;
wherein X is O, C or N, Y is O, C or N, and X and Y are different atoms.

18. The fabrication method according to claim 17, further comprising:
forming a buffer layer between the first film and the organic light emitting unit.

19. The organic light emitting film package structure according to claim 1, further comprising a buffer layer between the first film and the organic light emitting unit.

* * * * *